United States Patent
Noe et al.

(10) Patent No.: US 7,736,919 B2
(45) Date of Patent: Jun. 15, 2010

(54) METHOD OF PRODUCING A LIGHT-EMITTING DIODE COMPRISING A NANOSTRUCTURED PN JUNCTION AND DIODE THUS OBTAINED

(75) Inventors: Pierre Noe, Coublevie (FR); Frédéric Mazen, Grenoble (FR)

(73) Assignee: Commissariat a l'Energie Atomique, Paris (FR)

( * ) Notice: Subject to any disclaimer, the term of this patent is extended or adjusted under 35 U.S.C. 154(b) by 26 days.

(21) Appl. No.: 11/884,540

(22) PCT Filed: Feb. 23, 2006

(86) PCT No.: PCT/FR2006/000414

§ 371 (c)(1),
(2), (4) Date: Oct. 9, 2008

(87) PCT Pub. No.: WO2006/097591

PCT Pub. Date: Sep. 21, 2006

(65) Prior Publication Data

US 2009/0072245 A1 Mar. 19, 2009

(30) Foreign Application Priority Data

Mar. 15, 2005 (FR) .................................. 05 02530

(51) Int. Cl.
*H01L 21/00* (2006.01)
*H01L 27/15* (2006.01)

(52) U.S. Cl. .................. 438/22; 438/29; 257/E33.001; 977/774; 977/932

(58) Field of Classification Search .................. 438/22, 438/29; 977/774, 932

See application file for complete search history.

(56) References Cited

U.S. PATENT DOCUMENTS

| | | | | |
|---|---|---|---|---|
| 6,157,047 A | * | 12/2000 | Fujita et al. | ..................... 257/51 |
| 2003/0102444 A1 | * | 6/2003 | Deppert et al. | ......... 250/492.22 |
| 2004/0041144 A1 | * | 3/2004 | Shim et al. | ..................... 257/13 |
| 2005/0006636 A1 | * | 1/2005 | Shim et al. | ..................... 257/14 |

OTHER PUBLICATIONS

Chen, et al.; (Mar. 2004); "Stimulated emission in a nanostructured silicon pn junction diode using current injection"; Applied Physics Letters; vol. 84; No. 12; pp. 2163-2165.
Derivaz, et al.; (Apr. 2004); "Grazing incidence x-ray diffraction and atomic force microscopy investigations of geranium dots grown on silicon (001) by successive depositions of geranium through a thin silicon oxide layer"; Applied Physics Letters; vol. 84; No. 17; pp. 3295-3297.

* cited by examiner

*Primary Examiner*—Alexander G Ghyka
(74) *Attorney, Agent, or Firm*—Oliff & Berridge PLC

(57) ABSTRACT

A nanostructured pn junction light-emitting diode is fabricated from a semi-conducting substrate doped by a first dopant and covered by a dielectric thin layer. An amorphous thin film formed by a semi-conducting material doped by a second dopant of opposite type to that of the first dopant is then deposited on the surface of the dielectric thin layer. The assembly then undergoes a thermal treatment designed to form, in the dielectric thin layer and from the amorphous thin film, a plurality of dots of nanometric size and made of semi-conducting material doped by the second dopant. The dots are designed to be in epitaxial relationship with the substrate to form a plurality of pn junctions of nanometric size. An additional thin layer is then formed by epitaxial growth from the dots.

13 Claims, 3 Drawing Sheets

METHOD OF PRODUCING A LIGHT-EMITTING DIODE COMPRISING A NANOSTRUCTURED PN JUNCTION AND DIODE THUS OBTAINED

BACKGROUND OF THE INVENTION

The invention relates to a method for producing a nanostructured pn junction light-emitting diode comprising a semi-conducting substrate doped by a first dopant.

The invention also relates to a nanostructured pn junction light-emitting diode obtained by such a method.

STATE OF THE ART

Silicon being the most widely used semi-conducting material in the micro-electronics industry, fabricating opto-electronic integrated circuits with a silicon substrate would be particularly advantageous, in particular to reduce the manufacturing costs of such integrated circuits. This would also enable the technological knowledge derived from the silicon technology to be used to advantage in opto-electronic applications. However, the indirect energy bandgap of bulk monocrystalline silicon does not enable the latter to be an efficient light emitter and prevents its use as integrated light source, in particular as lasing medium of laser.

Different approaches such as the use of silicon nanocrystals, $Si/SiO_2$ superlattices, porous silicon or erbium-doped silicon have been envisaged to improve the luminescence of silicon. Efficient electroluminescence at the silicon bandgap has been able to be observed on silicon-based diodes using such approaches but the luminescence efficiencies remain low. Moreover, none of these approaches has enabled current injection to be used to achieve the population inversion necessary to obtain stimulated emission in silicon.

Another approach proposed by M. J. Chen and al., in the article "Stimulated emission in a nanostructured silicon pn junction diode using current injection" (Applied Physics Letters, 2004, Vol 84, No. 12, pages 2163-2165), consists in using a bulk silicon-based diode comprising a plurality of pn junctions having dimensions of around one nanometer. Such a diode is called nanostructured pn junction diode.

M. J. Chen and al. thus achieved a nanostructured pn junction diode by non-uniform diffusion of p-type dopant in an n-doped silicon substrate. A solution containing boron particles, silicon oxide nanoparticles and a solvent, is deposited by spin-coating on the free surface of a silicon substrate doped by an n-type dopant. Such a deposition technique is also known under the name of spin-on dopant.

A certain quantity of boron and silicon oxide then adsorbs at the surface of the substrate. Annealing at about 1000° C. is then performed so as to enable localized boron doping by thermal diffusion from the free surface of the substrate down to a depth of a few nanometers. Doping is in fact localized, as the presence of the $SiO_2$ nanoparticles, on the free surface of the substrate, locally blocks thermal diffusion of the boron and prevents uniform boron diffusion. This causes the formation of a plurality of $p^+$-doped silicon regions, of nanometric size, in the n-doped silicon substrate and therefore the formation of nanometric pn junctions. A waveguide is then etched in the substrate and electrical contacts are arranged at the periphery of the waveguide to perform current injection via the different pn junctions. M. J. Chen and al. in this way succeeded in measuring stimulated emission at energies close to the silicon bandgap, in such a nanostructured pn junction diode, by current injection.

Although a nanostructured silicon pn junction diode can be used as integrated light source, its fabrication method does however remain difficult to implement. Non-uniform diffusion of the dopant at the substrate surface is also difficult to control, which makes the formation and size of the $p^+$-doped regions, and therefore of the pn junctions, difficult to control. Such a method can in fact generate a $p^+$ dopant concentration gradient due to diffusion and therefore influence the abrupt nature of the pn junctions. Moreover, the non-uniform diffusion step and the annealing step are generally performed in separate chambers, which can give rise to diode contamination problems when going from one chamber to the other. In addition, the annealing step, performed at about 1000° C., for in general a time of 30 minutes, requires a large thermal budget.

OBJECT OF THE INVENTION

It is one object of the invention to provide a method for fabricating a nanostructured pn junction light-emitting diode that remedies the shortcomings of the prior art.

According to the invention, this object is achieved by the fact that the method successively comprises at least:
   a deposition step, on the surface of a dielectric thin layer covering said substrate, of an amorphous thin film formed by a semi-conducting material doped by a second dopant of an opposite type from that of the first dopant,
   a thermal treatment step designed to form, in the dielectric thin layer and from the amorphous thin film, a plurality of dots made of semi-conducting material doped by the second dopant, of nanometric size and in epitaxial relationship with the substrate, to form a plurality of pn junctions of nanometric size,
   and a formation step of an additional thin layer, on the surface of the dielectric thin layer, by epitaxial growth from the dots located in the dielectric thin layer.

According to a development of the invention, deposition of the amorphous thin film is performed by molecular beam epitaxy.

According to a preferred embodiment, the thermal treatment step comprises a first phase designed to form a plurality of polycrystalline clusters of nanometric size, on the dielectric thin layer and from the amorphous thin film, followed by a second phase designed to transform the plurality of polycrystalline clusters into the plurality of dots located in the dielectric thin layer and in epitaxial relationship with the substrate.

According to a particular embodiment of the invention, the first phase of the thermal treatment step is performed by a temperature increase up to a first temperature threshold of about 350° C., followed by maintaining the temperature at said first threshold for a predetermined first time. The second phase of the thermal treatment step is preferably performed by a progressive temperature increase up to a second temperature threshold that is higher than the first threshold, followed by maintaining the temperature at said second threshold for a predetermined second time.

It is a further object of the invention to provide a nanostructured pn junction light-emitting diode, that is easy to produce and is reliable.

According to the invention, this further object is achieved by the fact that it comprises at least:
   a semi-conducting substrate doped by a first dopant and covered by a dielectric thin layer,
   and a plurality of dots of nanometric size, made of a semi-conducting material doped by a second dopant of opposite type to that of the first dopant and arranged in the dielectric thin layer, each dot being in epitaxial relationship with said substrate and with an additional thin layer covering the dielectric thin layer.

BRIEF DESCRIPTION OF THE DRAWINGS

Other advantages and features will become more clearly apparent from the following description of particular embodiments of the invention given as non-restrictive examples only and represented in the accompanying drawings, in which.

DESCRIPTION OF PARTICULAR EMBODIMENTS

According to a particular embodiment represented in FIGS. 1 to 9, a nanostructured pn junction light-emitting diode is achieved from a semi-conducting substrate 1 doped by a first dopant and covered by a dielectric thin layer 2. The substrate is, for example, a bulk silicon substrate doped by an n-type dopant such as arsenic or phosphorus. The dielectric thin layer 2 is preferably formed by a thermally decomposable component and, more particularly, decomposable by the effect of a temperature comprised between 720° C. and 750° C. The decomposable component is, for example, chosen from silicon oxide and silicon nitride. The dielectric thin layer 2 preferably has a thickness of about a few nanometers. The thickness of the dielectric thin layer 2 is for example 2 nm.

Figure 1:
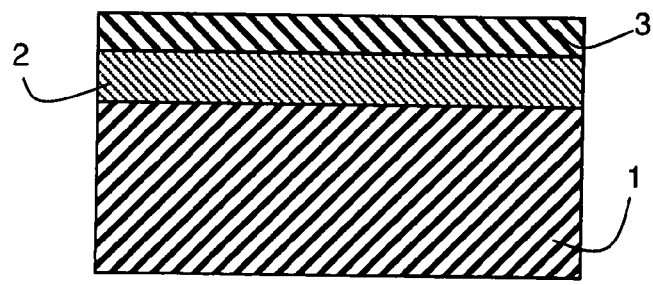
FIGS. 1 to 9 schematically represent, in cross-section, different steps of a method for fabricating a nanostructured pn junction light-emitting diode according to the invention.

As represented in FIG. 1, an amorphous thin film 3 is deposited on the surface of the dielectric thin layer 2 at a temperature preferably lower than or equal to 250° C.

The amorphous thin film 3 is formed by an amorphous semi-conducting material doped by a second dopant of opposite type to that of the first dopant, and its thickness is preferably about a few nanometers, for example from 1 to 2 nm. Thus, for a substrate doped by an n-type dopant, the amorphous thin film is doped by a p-type dopant and vice-versa. With an n-type doped silicon substrate, the amorphous thin film 3 is for example made of boron-doped silicon.

The amorphous thin film 3 can be deposited by any type of known process. It is for example deposited by Molecular Beam Epitaxy, commonly referred to by the abbreviation MBE. Thus, to deposit an amorphous thin film of boron-doped silicon, silicon and boron are deposited on the surface of the dielectric thin layer, by co-evaporation in an ultra-high vacuum, respectively by means of an electron beam gun and a Knudsen type high-temperature evaporation cell.

The stacking formed by the substrate 1, the dielectric thin layer 2 and the amorphous thin film 3 then undergoes a thermal treatment step designed to form, in the dielectric thin layer 2, a plurality of dots of semi-conducting material doped by the second dopant, these dots being of nanometric size and in epitaxial relationship with the substrate, which enables a plurality of pn junctions of nanometric size to be formed. The dots in epitaxial relationship with the substrate 1 are thus distributed within the dielectric thin layer 2.

Figure 2:
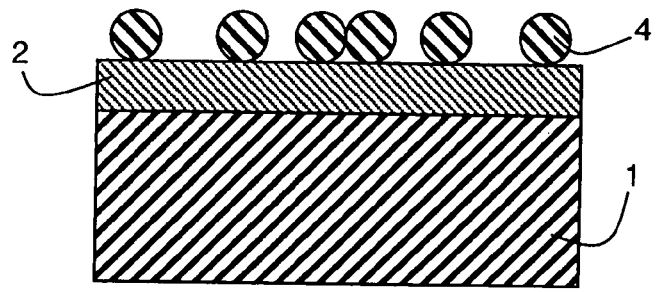
Figure 3:
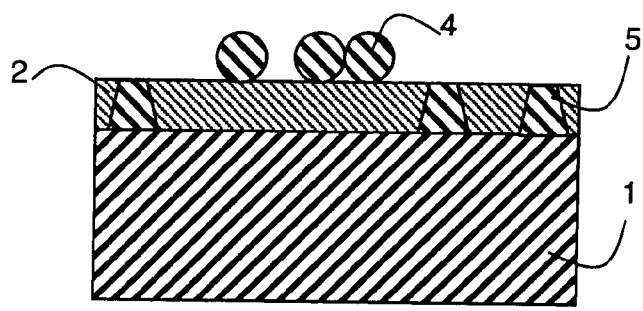
Figure 4:
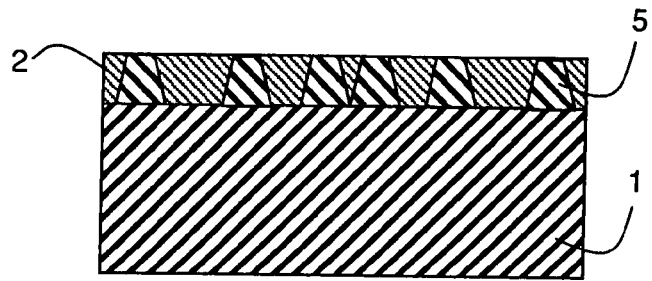

As represented in FIGS. 2 to 4, the thermal treatment step preferably comprises a first phase designed to form, on the dielectric thin layer 2 and from the amorphous thin film 3, a plurality of polycrystalline clusters 4 of nanometric size, also called polycrystalline boxes or polycrystalline clusters arranged on the dielectric thin layer 2. The polycrystalline clusters 4 are formed by crystallization of the amorphous thin film 3 in the form of clusters or dots, and they are distributed over the dielectric thin layer 2 and most of them are isolated from one another.

The first phase of the thermal treatment enabling formation of the polycrystalline clusters 4 on the dielectric thin layer 2 is preferably achieved by a temperature increase up to a first threshold of about 350° C., followed by maintaining the temperature at said first threshold for a predetermined first time, for example about fifteen minutes.

Thus, as illustrated in FIG. 2, this first phase of the thermal treatment step enables the doped semi-conducting material of the amorphous thin film 3 to be crystallized by annealing. This crystallization is accompanied by transformation of the continuous amorphous thin film 3 into a plurality of discontinuous polycrystalline clusters 4 arranged at the surface of the dielectric thin layer 2. Said polycrystalline clusters are also called polycrystalline elements or dots. The clusters 4 are thus formed by the doped semi-conducting material but, unlike the amorphous thin film 3, they are polycrystalline and discontinuous.

The first phase of the thermal treatment step is preferably followed by a second phase comprising a progressive temperature increase up to a second threshold, higher than that of the first phase, followed by maintaining the temperature at said second threshold for a predetermined second time, for example about 5 to 10 minutes. The predetermined second time depends in particular on the thickness of the dielectric thin layer 2. The second temperature threshold is preferably comprised between 720° C. and 750° C. The second phase induces, as illustrated in FIGS. 3 and 4, progressive transformation of the polycrystalline clusters 4 into dots 5 distributed within the dielectric thin layer 2 and in epitaxial relationship with the substrate 1. Formation of the dots 5 in epitaxial relationship with the substrate 1 is performed by thermal breakdown of the regions of the dielectric thin layer 2 located under the polycrystalline clusters or elements 4 and by epitaxy of said clusters with the substrate 1. The polycrystalline clusters 4 located at the surface of the dielectric thin layer 2 then disappear progressively give way to the dots 5 in epitaxial relationship with the substrate 1 and located in the dielectric thin layer 2.

In FIG. 4, the dots 5 arranged in the dielectric thin layer 2 are represented schematically and in cross-section in the form of trapezoids whereas in FIGS. 2 and 3, the polycrystalline clusters or elements 4 arranged on the dielectric thin layer 2 are represented schematically and in cross-section in the form of circles. The distance between the two parallel planes of each dot 5 represented in FIG. 4 is, more particularly, equal to the thickness of the dielectric thin layer 2, this distance also being called height. In this way, one of the two parallel planes of each dot forms the contact zone with the substrate 1 whereas the other plane is comprised in the plane of the free surface of the dielectric thin layer 2.

The thermal treatment phases, illustrated in FIGS. 2 to 4, are the same as those described in the article "Grazing incidence x-ray diffraction and atomic force microscopy investigations of germanium dots grown on silicon (001) by successive depositions of germanium through a thin silicon oxide layer" by M. Derivaz and al. (Applied Physics Letters, 2004, Vol 84, No. 17, pages 3295-3297) describing formation of germanium quantum dots or bridges by heteroepitaxial growth on a silicon substrate.

The thermal treatment step is then followed by a formation step, on the surface of the dielectric thin layer 2, of a continuous additional thin layer 6, by epitaxial growth from the dots 5. The epitaxial growth step from the dots 5 thus first enables additional clusters to form, at the surface of the dielectric thin layer 2, in epitaxy with the dots 5, the additional clusters continuing their growth until they come into contact with one another and form a continuous thin layer. More particularly, this enables an additional thin layer 6 to be obtained, for example formed by the semi-conducting material doped by the second dopant and constituting the dots 5. The additional thin layer could also be formed by a non-doped semi-conducting material.

Figure 5:
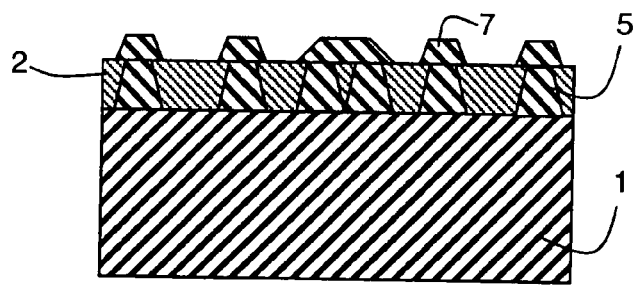
Figure 6:
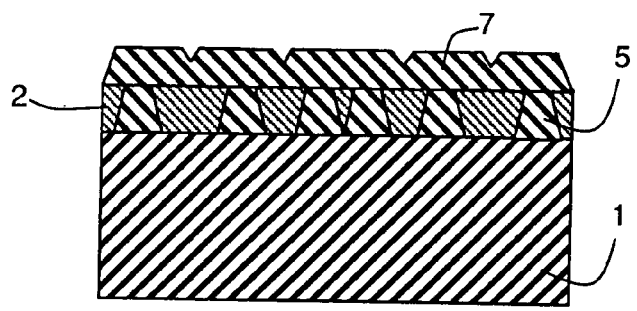
Figure 7:
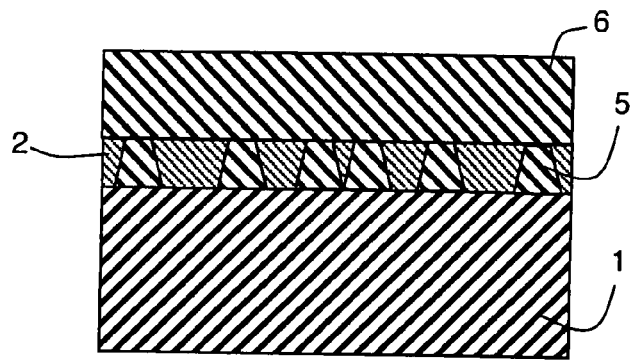

FIGS. 5 to 7 illustrate progressive formation of said additional thin layer 6, by resumption of epitaxial growth of the dots 5. Thus, in FIG. 5, discontinuous regions 7 of semi-conducting material, that may be doped and crystallized and forming the additional clusters, grow at the surface of the dielectric thin layer 2, above the zones occupied by the dots 5. Growth of the regions 7 then continues (FIGS. 6 and 7) so as to form a continuous layer constituting the additional thin layer 6.

The thickness of the additional thin layer 6 depends on the density of the dots 5 in the dielectric thin layer 2 and also on the dot size. The density of the dots 5 in the dielectric layer can, for example, be controlled using surface active agents or surfactants such as nitrogen, hydrogen, etc. . . . In addition, the size of the dots 5 in the dielectric thin layer 2 can be controlled by the quantity of silicon deposited, in conjunction with the predetermined times of the thermal treatment phases. The size and position of the dots 5 in the dielectric thin layer 2 can also be controlled by methods for local weakening of the dielectric thin layer 2, by means for example of a Scanning Tunneling Microscopy (STM) tip. Such methods can for example organize the dots 5 within the dielectric layer 2.

Figure 8:
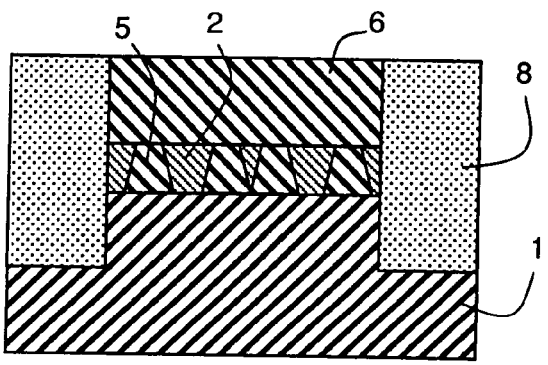
Figure 9:
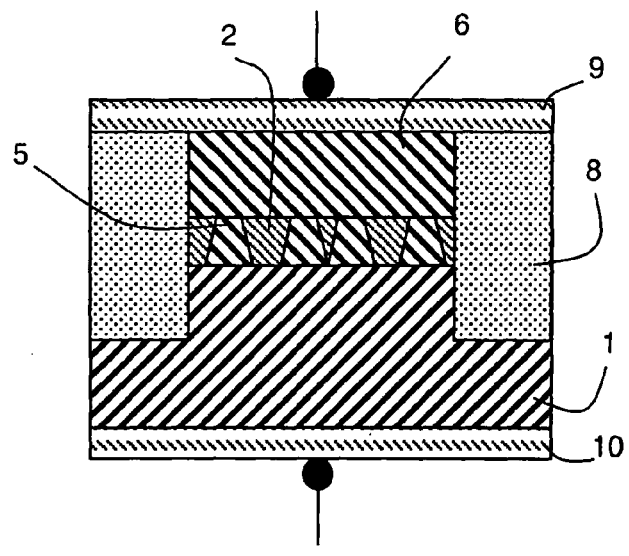

As illustrated in FIGS. 8 and 9, fabrication of the nanostructured pn junction light-emitting diode can be completed by forming a waveguide by patterning the additional thin layer 6, the dielectric thin layer 2 and a part of the substrate 1. Patterning can be performed for example by optical lithography. Then an insulating layer 8, for example made of silicon oxide or silicon nitride, can be deposited at the periphery of the waveguide. First and second metal layers 9 and 10 forming electrical connection contacts are then deposited, respectively on the additional thin layer 6 and on the free surface of the substrate 1, so as to enable electronic carriers to be injected into the nanostructured pn junction diode.

Such a method of fabricating a nanostructured pn junction light-emitting diode presents the advantage of being easy to implement, the main fabrication steps, i.e. up to achievement of the waveguide, being in fact able to be performed in the same chamber, which also avoids any dot contamination and oxidation problems. Moreover, achieving the pn junctions by epitaxy enables a crystalline coherence to be obtained between the substrate 1, dots 5 and additional thin layer 6, which improves the reliability of the light-emitting diode and the definition of the pn junctions, and also its integration capacity in another device. Furthermore, the temperature necessary to achieve the dots 5 and therefore the pn junctions is relatively low in comparison with that used in the prior art. In addition, the junctions are more often than not insulated from one another by a dielectric material forcing injection of the electronic carriers through these pn junctions.

Figure 10:
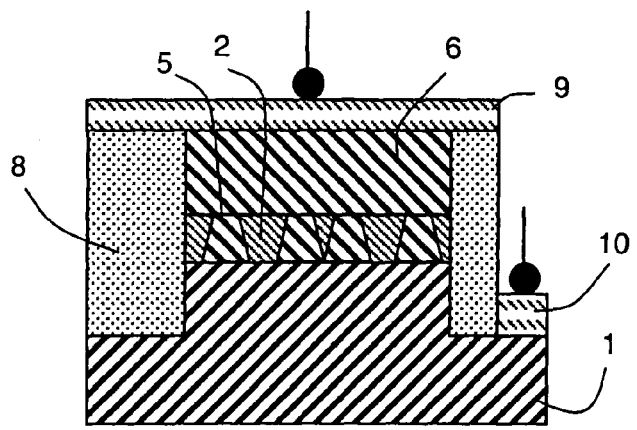
FIGS. 10 and 11 respectively represent, in cross-section, first and second alternative embodiments of a nanostructured pn junction light-emitting diode according to the invention.

In a first alternative embodiment represented in FIG. 10, the second metal layer 10 is deposited on the substrate 1 in a region located at the periphery of the waveguide.

Figure 11:
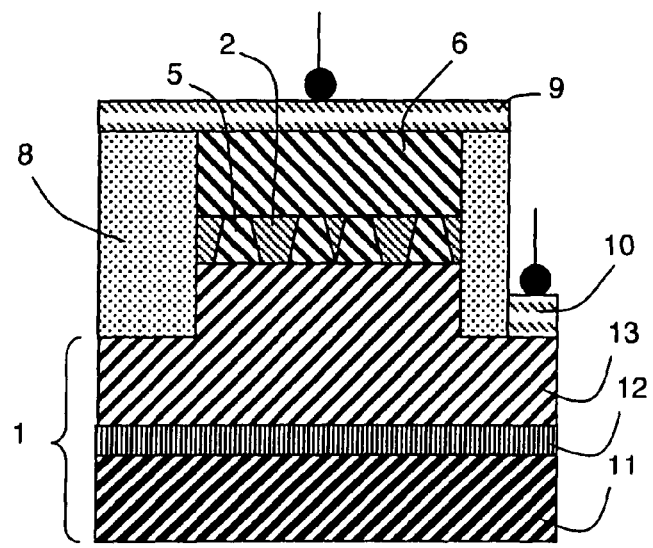

In a second alternative embodiment represented in FIG. 11, the bulk silicon substrate 1 is replaced by a silicon on insulator or SOI substrate. Thus, it comprises a stacking successively comprising a bulk silicon support 11, a silicon oxide insulating layer 12 and a film 13 made of bulk silicon doped by a dopant, for example of n type, if the dots 5 are p-doped. The film 13 is in contact with the dots 5 located in the dielectric thin layer 2.

The invention is not limited to the embodiments described above. The semi-conducting material forming the dots 5 and the additional thin layer 6 can thus be made from germanium.

In addition, the semi-conducting substrate can be chosen from among silicon, germanium, silicon on insulator (SOI) and germanium on insulator substrates.

The invention claimed is:

1. Method for producing a nanostructured pn junction light-emitting diode comprising a semi-conducting substrate doped by a first dopant, successively comprising at least:
   a deposition step, on the surface of a dielectric thin layer covering said substrate, of an amorphous thin film formed by a semi-conducting material doped by a second dopant of an opposite type from that of the first dopant,
   a thermal treatment step designed to form, in the dielectric thin layer and from the amorphous thin film, a plurality of dots made of semi-conducting material doped by the second dopant, of nanometric size and in epitaxial relationship with the substrate, to form a plurality of pn junctions of nanometric size,
   and a formation step of an additional thin layer, on the surface of the dielectric thin layer, by epitaxial growth from the dots located in the dielectric thin layer.

2. Method according to claim 1, wherein deposition of the amorphous thin film is performed by molecular beam epitaxy.

3. Method according to claim 1, wherein the additional thin layer is formed by the semi-conducting material constituting the plurality of dots in epitaxial relationship with the substrate.

4. Method according to claim 3, wherein the additional thin layer is doped by the second dopant.

5. Method according to claim 1, wherein the thermal treatment step comprises a first phase designed to form a plurality of polycrystalline clusters of nanometric size, on the dielectric thin layer and from the amorphous thin film, followed by a second phase designed to transform the plurality of polycrystalline clusters into the plurality of dots located in the dielectric thin layer and in epitaxial relationship with the substrate.

6. Method according to claim 5, wherein the first phase of the thermal treatment step is performed by a temperature increase up to a first temperature threshold of about 350° C., followed by maintaining the temperature at said first threshold for a predetermined first time.

7. Method according to claim 6, wherein the second phase of the thermal treatment step is performed by a progressive temperature increase up to a second temperature threshold that is higher than the first threshold, followed by maintaining the temperature at said second threshold for a predetermined second time.

8. Method according to claim 7, wherein the second temperature threshold is comprised between 720° C. and 750° C.

9. Method according to claim 8, wherein the dielectric thin layer is formed by a compound decomposable by the effect of a temperature comprised between 720° C. and 750° C.

10. Method according to claim 9, wherein the decomposable compound is chosen from silicon oxide and silicon nitride.

11. Method according to claim 1, wherein the semi-conducting material is chosen from silicon and germanium.

12. Method according to claim 1, wherein the semi-conducting substrate is chosen from silicon, germanium, silicon on insulator and germanium on insulator substrates.

13. Method according to claim 1, wherein the formation step of the additional thin layer is followed by a structuring step of said additional thin layer, of the dielectric thin layer and of a part of the substrate to form at least one waveguide, and by a deposition step of an insulating layer at the periphery of the waveguide.

* * * * *